United States Patent
Wang et al.

(10) Patent No.: US 9,189,379 B2
(45) Date of Patent: Nov. 17, 2015

(54) BUFFER FOR MANAGING DATA SAMPLES IN A READ CHANNEL

(71) Applicant: LSI Corporation, San Jose, CA (US)

(72) Inventors: Herjen Wang, Sunnyvale, CA (US); Ngok Ying Chu, Los Altos, CA (US); Johnson Yen, Fremont, CA (US); Lei Chen, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 207 days.

(21) Appl. No.: 13/760,447

(22) Filed: Feb. 6, 2013

(65) Prior Publication Data

US 2014/0223114 A1  Aug. 7, 2014

(51) Int. Cl.
*G06F 12/00* (2006.01)
*G11C 29/02* (2006.01)

(52) U.S. Cl.
CPC .............. *G06F 12/00* (2013.01); *G11C 29/022* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 6,604,220 B1* | 8/2003 | Lee | 714/769 |
| 6,674,753 B1 | 1/2004 | Harasaki et al. | |
| 7,555,070 B1* | 6/2009 | Ulriksson et al. | 375/341 |
| 7,974,034 B1* | 7/2011 | Han et al. | 360/51 |
| 8,810,938 B1* | 8/2014 | Madden et al. | 360/27 |
| 8,862,971 B1* | 10/2014 | Chan et al. | 714/795 |
| 2002/0046251 A1 | 4/2002 | Siegel | |
| 2008/0002791 A1* | 1/2008 | Gratrix et al. | 375/341 |
| 2011/0080211 A1* | 4/2011 | Yang et al. | 327/551 |
| 2011/0085628 A1* | 4/2011 | Kaynak et al. | 375/350 |
| 2011/0167227 A1* | 7/2011 | Yang et al. | 711/154 |
| 2011/0264980 A1* | 10/2011 | Li et al. | 714/752 |
| 2012/0063284 A1* | 3/2012 | Mathew et al. | 369/53.44 |

* cited by examiner

*Primary Examiner* — Charles Rones
*Assistant Examiner* — Hewy Li

(57) ABSTRACT

The disclosure is directed to a system for managing data samples utilizing a time division multiplexing controller to allocate time slots for accessing a sample memory according to one or more modes of operation. The time division multiplexing controller is configured to allocate slots for concurrent access by a sample controller, a plurality of detectors, and a noise predictive calibrator when a normal mode is enabled. The time division multiplexing controller is further configured to allocate slots excluding at least one of the sample controller, the plurality of detectors, and the noise predictive calibrator from accessing the sample memory when a retry mode is enabled. In some embodiments, the time division multiplexing controller is further configured to allocate time slots for one or more clients other than the sample controller, the plurality of detectors, and the noise predictive calibrator.

20 Claims, 3 Drawing Sheets

BUFFER FOR MANAGING DATA SAMPLES IN A READ CHANNEL

FIELD OF INVENTION

The disclosure is directed to systems and method for managing data samples.

BACKGROUND

In some embodiments, an iterative decoding scheme of a read channel includes a buffer for managing data samples transferred between a front-end acquisition module, such as a Viterbi decoder, and a back-end decoder, such as a low-density parity-check (LPDC) decoder. According to several dynamic modes of operation, a plurality of clients that make up a portion of the buffer or work alongside the buffer will simultaneously demand access to data samples stored in the buffer. High bandwidth is often required to maintain data integrity while facilitating access to the clients.

SUMMARY

An embodiment of the disclosure includes a system for managing data samples. A sample acquisition module is configured to receive data samples from a storage device. A sample controller is configured to write data samples received from the sample acquisition module to a sample memory. The sample controller is further configured to read data samples from the sample memory.

One or more detectors are configured to read data samples from the sample memory and to decode the data samples utilizing a maximum a posteriori decoding algorithm. The detectors are further configured to send maximum a posteriori data associated with the decoded data samples to a decoder.

A noise predictive calibrator is configured to read data samples from the sample memory and to calibrate an impulse response coefficient of a filter based upon an input noise associated with the data samples read from the sample memory. The filter is configured to at least partially compensate for the input noise based upon the impulse response coefficient.

A time division multiplexing controller is configured to allocate time slots for accessing the sample memory according to one or more modes of operation. The time division multiplexing controller is configured to allocate slots for concurrent access by the sample controller, the plurality of detectors, and the noise predictive calibrator when a normal mode is enabled. The time division multiplexing controller is further configured to allocate slots excluding at least one of the sample controller, the plurality of detectors, and the noise predictive calibrator from accessing the sample memory when a retry mode is enabled. In some embodiments, the time division multiplexing controller is further configured to allocate time slots for one or more clients other than the sample controller, the plurality of detectors, and the noise predictive calibrator according to one or more selected modes of operation.

It is to be understood that both the foregoing general description and the following detailed description are not necessarily restrictive of the disclosure. The accompanying drawings, which are incorporated in and constitute a part of the specification, illustrate embodiments of the disclosure.

BRIEF DESCRIPTION OF THE DRAWINGS

The embodiments of the disclosure may be better understood by those skilled in the art by reference to the accompanying figures in which.

DETAILED DESCRIPTION

Reference will now be made in detail to the embodiments disclosed, which are illustrated in the accompanying drawings.

Figure 1:
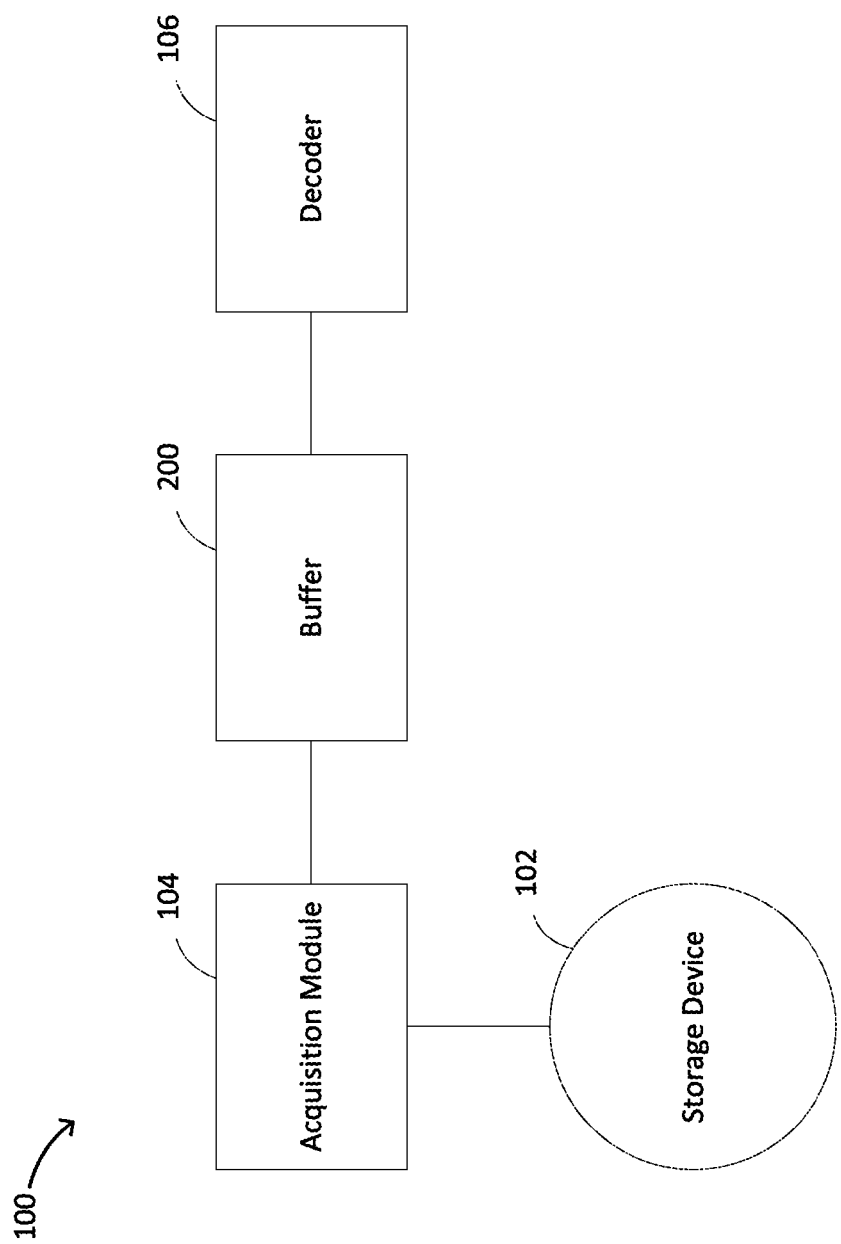
FIG. 1 is a block diagram illustrating a system for decoding data samples read from a storage device, in accordance with an embodiment of the disclosure.
Figure 2:
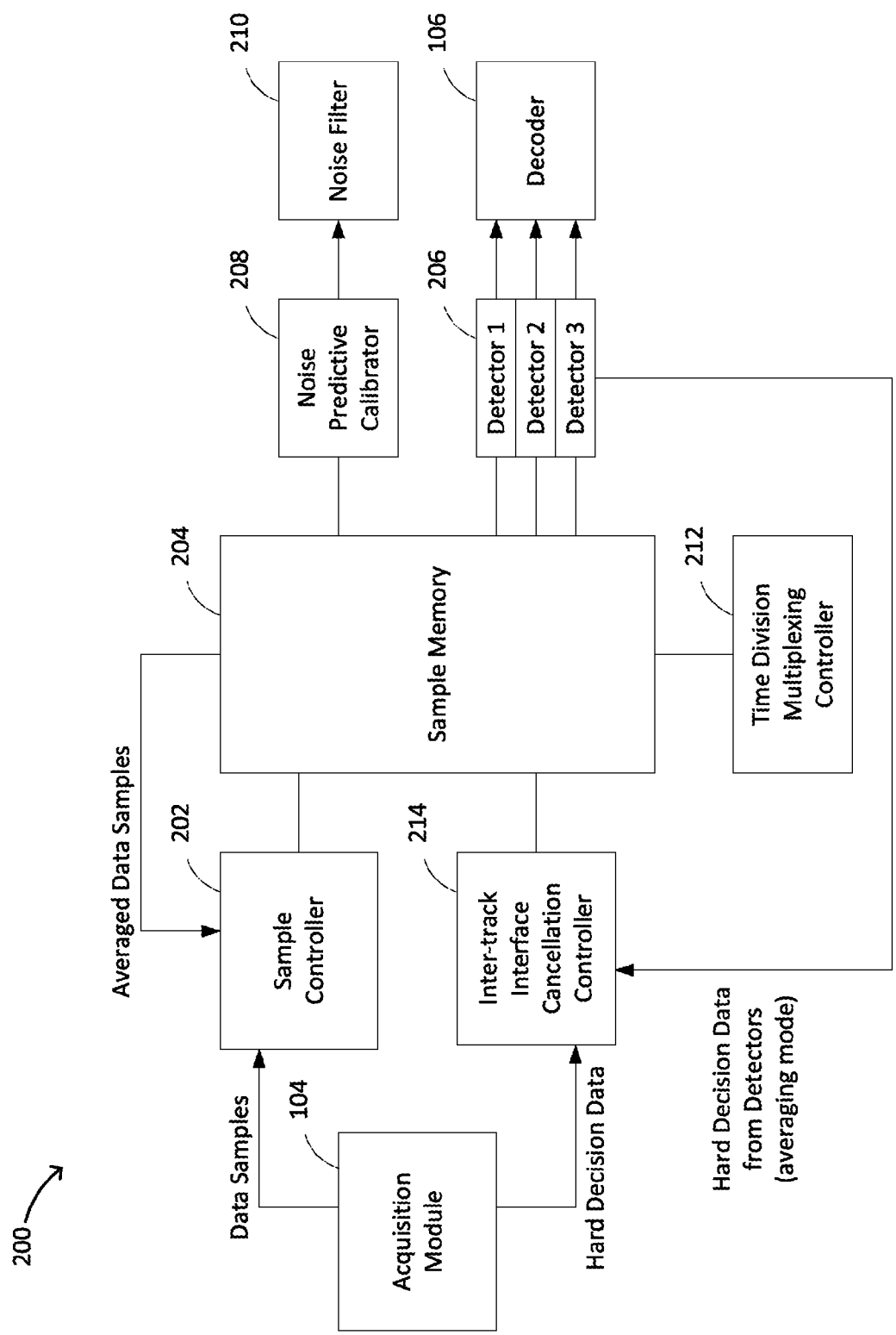
FIG. 2 is a block diagram illustrating a buffer for managing data samples within the system for decoding data samples read from the storage device, in accordance with an embodiment of the disclosure.
Figure 3:
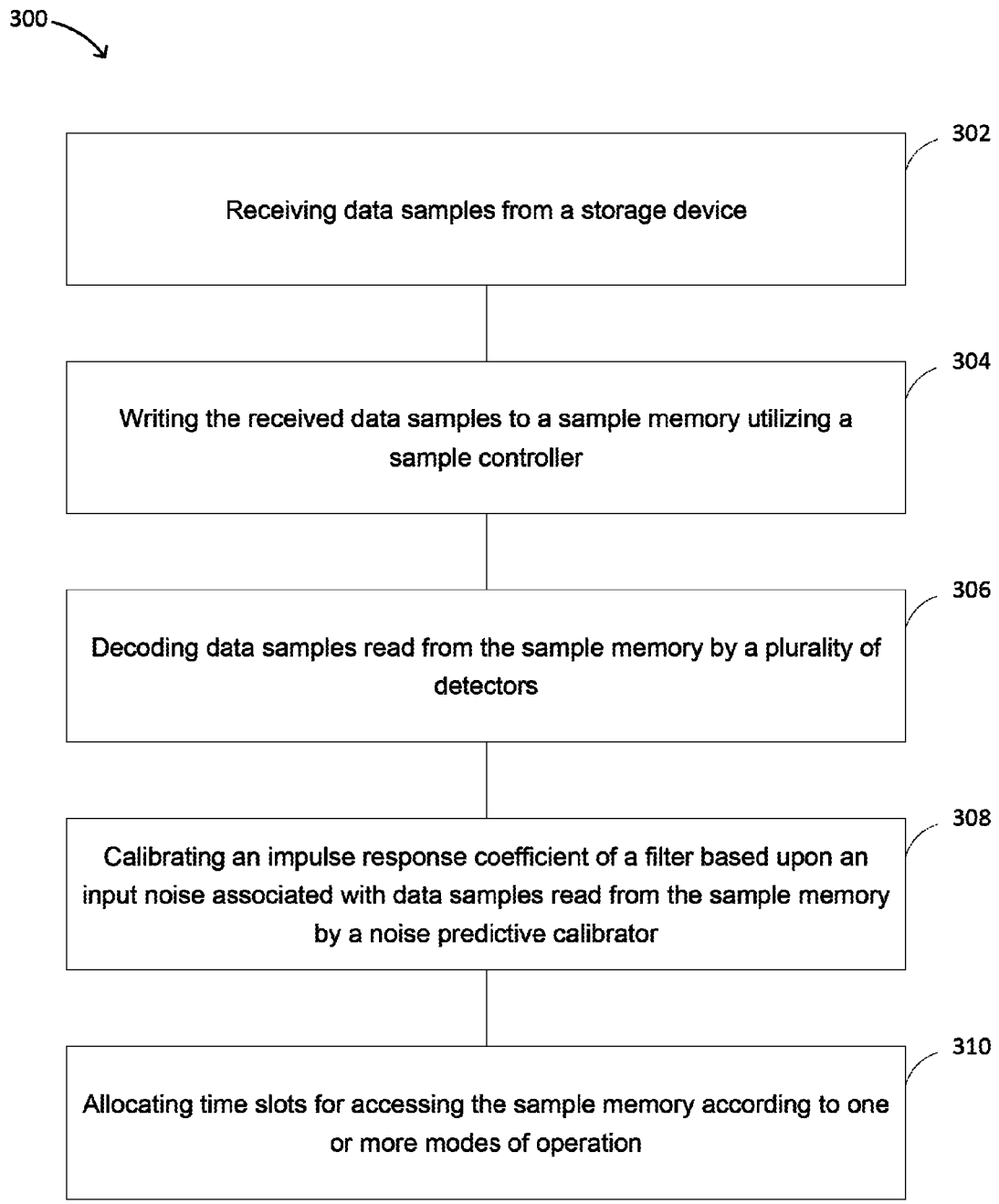
FIG. 3 is a flow diagram illustrating a method of managing data samples read from a storage device, in accordance with an embodiment of the disclosure.

FIGS. 1 through 3 illustrate embodiments of a system and method for managing data samples read from a storage device 102 such as, but not limited to, a hard disk drive (HDD) or a solid state disk (SSD). In some embodiments, as illustrated by FIG. 1, a system 100 for decoding data samples from the storage device 102 includes an acquisition module 104 communicatively coupled to a decoder 106 (e.g. LPDC decoder) by a buffer 200. In some embodiments, the system 100 includes at least a portion of a read channel incorporating one or more of the acquisition module 104, the buffer 200, and the decoder 106.

Each of the acquisition module 104, the buffer 200, and the decoder 106 includes hardware, software, firmware, or any combination of the foregoing configured for executing one or more of the corresponding steps or functions described herein. In some embodiments, program instructions associated with one or more of the steps or functions are stored on at least one carrier medium and executed by at least one processor. In some embodiments, one or more of the steps or functions are executed by electronic circuitry.

In an embodiment, illustrated in FIG. 2, the buffer 200 includes a sample controller 202 configured to store data samples received from the storage device 102 by the acquisition module 104 to a sample memory 204. In some embodiments, the data samples stored to the sample memory 204 are signed 6-bit data samples. In some embodiments, the sample controller 202 is configured to write the data samples to the sample memory 204 at 4 samples per quarter rate clock. In some embodiments, the sample controller 202 is further configured to read data samples from the sample memory 204 and write back averaged data samples to the sample memory 204 when an averaging mode is enabled.

In some embodiments, the sample controller 202 packs the input data samples to memory boundary and generates a write request to the sample memory 204. The sample controller 202 is further configured to perform an averaging function when the average mode is turned on. In some embodiments, the averaging mode only works when retry mode is also turned on. In normal mode, the average weight for incoming sample is 100%, and the old data sample weight should be zero. In some embodiments, when the averaging mode is enabled, the average weight of incoming data is 8/8 on the first read, 4/8 on the second read, 3/8 on the third read, 2/8 on the fourth and fifth read, and 1/8 on the following reads. In some embodiments, the old data samples are stored in sample memory 204 at the previous read and retrieved at the current sector. In some embodiments, the incoming samples are 6 bits wide and four samples at a time, and the old samples are 9 bits wide and are stored at the same location of the sample memory 204. If there is a sync-miss at the current fragment, the previous fragment data is duplicated for the current fragment result and incoming fragment data is discarded. In some embodiments, the sample controller is further configured to generate write and read addresses for writing data to or reading data from the sample memory 204.

In some embodiments, sample memory 204 has a width of 2×216 bits. In some embodiments, the sample memory is split into two memory banks operated at octal rate clock and is capable of interfacing to quarter rate clock without a synchronizer. In some embodiments, the sample memory 204 includes 2944 rows to accommodate five 4-kilobyte sectors up to 3,452 symbols long or 37 512-kilobyte sectors up to 444 symbols long in 12-bit mode. In some embodiments, 6 extra samples (i.e. start of sector "SOS" bits) are stored at the starting point of a sector followed by user data, and 12 extra samples (i.e. end of sector "EOS" bits) are stored at the end of the sector. In some embodiments, 3 extra samples (i.e. bridging bits) are stored at each of the starting point and end of a fragment regardless of whether the fragment is caused by a second sync mark or an actual split of a sector.

One or more detectors 206, such as 3-stream detector modules, are configured to receive data samples from the sample memory 204. In some embodiments, the buffer 200 is configured to provide three sets of data sent in parallel to the detectors 206 (e.g. 18 samples per quarter rate clock or 36 samples per octal rate clock). In some embodiments, the detectors 206 are further configured to decode the data samples according to a maximum a posteriori (MAP) decoding algorithm. The MAP detectors 206 are further configured to output MAP data of the decoded data samples to decoder 106.

A noise predictive (NP) calibrator 208 is also configured to read data from the sample memory 204. The NP calibrator 208 is configured to detect an input noise associated with data samples read from the sample memory 204. The NP calibrator 208 is further configured to determine/calibrate an impulse response coefficient for a digital filter 210 based upon the input noise. The noise filter 210 utilizes the impulse response coefficient to digitally compensate at least a portion of the input noise of the buffer 200. In some embodiments, the NP calibration requires 4 samples per quarter rate clock from a current code word. In some embodiments, only user data is required so all the bridging bits, SOS bits, and EOS bits are not needed.

A time division multiplexing (TDM) controller 212 is configured for managing access to the sample memory 204 by the sample controller 202, the detectors 206, the NP calibrator 208, and any other client requesting access to the sample memory 204. The TDM controller 212 is configured to allocate time slots allowing one or more clients to access the sample memory 204 according to one or more selected modes of operation and a selected operating state.

FIG. 3 illustrates an embodiment of a method 300 of managing samples in accordance with systems 100 and 200. At step 302, the acquisition module 104 receives data samples from the communicatively coupled storage device 102. In some embodiments, the acquisition module 104 is configured to filter the data samples in preparation for decoding. At step 304, the data samples are sent to the buffer 200 and the sample controller 202 writes the samples to the sample memory 204. At step 306, the data samples are read from the sample memory by the MAP detectors 206. The MAP detectors 206 send MAP data associated with the samples to the backend decoder 106. At step 308, the NP calibrator 208 determines the impulse response coefficient of the noise filter 210 utilizing the input noise associated with data samples read from the sample memory 204 by the NP calibrator 208. According to step 310, access to the sample memory 204 is facilitated by the TDM controller 212 based upon one or more selected operating modes and TDM states.

In some embodiments, the operating modes include a normal mode and a retry mode. According to the normal mode of operation, the TDM controller 212 is configured to allocate slots for concurrent access to the sample memory 204 by the sample controller 202, the MAP detectors 206, and the NP calibrator 208. In some embodiments, the sample memory 204 is operational at 72 samples per octal rate clock and it provides bandwidth for concurrent access. When the TDM controller 212 is in the normal mode of operation it allocates at least six slots to the following clients: Y samples write occur once every 9 octal rate clock, Map0 samples read occur once every 6 octal rate clock, Map1 samples read occur once every 6 octal rate clock, Map2 samples read occur once every 6 octal rate clock, and Np calibration samples read occur once every 9 octal rate clock, where one extra TDM slot is required when bridging bits are pruned.

In normal mode, a current sector of data samples is stored into the sample memory 204 by the sample controller 202 while previous sectors data samples are being read by the MAP detectors 206. The operation of memory storage and retrieval is controlled by a scheduler of the TDM and parallel operation is achieved for increased system performance. In retry mode, only one sector is active at a time in sequence block "seqblk" level, no new sector of data samples is available until the current sector of hard decision data are completely sent out of seqblk. The sector index is provided by the scheduler and the memory offset address of each sector is fixed. In some embodiments, 4 data samples are fed to the buffer 200 by the acquisition module 104 at every quarter rate clock.

In some embodiments, a 4 KB sector can be split up to 7 fragments with a second sync mark existed and up to 8 fragments without a second sync mark. In some embodiments, a 512B sector can be split up to 3 fragments with a second sync mark existed and up to 4 fragments without a second sync mark. In some embodiments, the handling of memory sectors is compliant with MAMBA design. Because each sector data can be split into several fragments due to physical sector split or second sync mark, a fragment controller in communication with the sample memory 204 is configured to keep track fragment information to properly locate the bridging bits and user bits. In some embodiments, the fragment controller is a timing controller for split fragment and fragments caused by the second sync mark. The fragment controller is used by the sample controller 202 to insert EOS bits, bridging bits and SOS bits.

In some embodiments, a no-sync-mark recovery (NSMR) controller in communication with the sample memory 204 is configured to keep track of all the state variables of current NSMR iteration. The state variables are used by a MAP address generator to assemble data correctly. In some embodiments, the variables include but are not limited to: sync mark search window position, address generation of corresponding memory location, valid data pattern at fragment border appeared in memory line, sync mark missing fragment crossing chunks, address generation of memory location to construct chunk from one or more fragments. Because there is no sync mark at certain fragments, extra data from sync mark search window are stored in sample memory 204 and hence current fragment is longer than expected fragment length, resulting in an increased length of the final sector. Therefore, data pruning is necessary when constructing three chunks of data for MAP.

When a sync mark is not found, data samples must either be duplicated from prior valid data samples or initiate the assertion of an erasure signal. In some embodiments, an erasure controller is configured to raise an erasure flag if there are no prior valid samples so that the alignment module sends zero to the interleaver. For any sector or fragment read at the first time, there is no valid data corresponding to that particular sector or fragment in the buffer 200. When the sync mark is not found in this read, erasure is asserted for erasure decoding. In some embodiments, the erasure signal covers 6 pre-fragment bridging bits and 6 post-fragment bridging bits. In some embodiments, the buffer 200 is further configured to store log-likelihood ratios (LLRs) associated with certain data transfers. In some embodiments, the alignment extends beyond to preceding 12 samples (LLR bits) of the first user bit in the current fragment and the following 24 samples (LLR bits) of the last user bit in the current fragment.

In some embodiments, a chunk controller keeps track of chunk starting location of each sector and generates the read request to the sample memory 204 so that at least three MAP data outputs are available at the same time. When sync is missing at beginning and there is no prior valid data in the buffer 200, an erasure signal is asserted to inform an alignment module for proper data selection so that an interleaver module will receive correct data when erasure decoding occurs. In some embodiments, the chunk controller is a timing controller for MAP chunk separation when writing and reading data samples. In some embodiments, each chunk size is evenly divided from a full sector length excluding bridging bits. In some embodiments, each chunk has 6 extra warming up bits at both beginning and end. In some embodiments, three MAP detectors 206 are working parallel on the same code word; therefore, the buffer 200 supplies three chunks of data to the three MAP detectors 206, respectively. The beginning of each chunk data is written at memory line boundary so that it can be read in three consecutive clocks for alignment at the output. If there is no fragmentation, a full sector length of data is evenly divided by three to make each chunk length equal. If there is a fragmentation due to a split or second sync mark in a chunk, extra 6 bridging bits are inserted for every fragment. When a split occurs at the chunk boundary, bridging bits are distributed among at least two chunks.

An inter-track interference (ITI) cancellation controller 214 is configured to write hard decision (HD) data to the sample memory 204 when an ITI cancellation mode is enabled. In some embodiments, the ITI cancellation controller 214 packs 4 bit hard decision data at every quarter rate clock to memory boundary and then generates a write request to store HD data to the sample memory 204 when ITI cancellation is turned on. The HD data is sourced from the MAP detectors 206 averaging mode is enabled, otherwise the HD data is sourced from the acquisition module 104. In ITI cancellation mode during retry, data samples of a code word are read to send to the ITI cancellation controller 214, and there is no MAP read during this time. In some embodiments, HD data are retrieved from the sample memory 204 and sent to the ITI controller 214. In some embodiments, data samples are also retrieved from sample memory 204 and sent to the ITI controller. In some embodiments, the ITI controller 214 is configured to construct the HD data or the data samples if there is more than one fragment in a sector.

In some embodiments, a write merge controller maintains a line buffer for outputs from the sample controller 202 and the ITI controller 214, respectively, and a read merge controller monitors the status of respective read line buffer for each of the MAP detectors 206, NP calibrator 208, ITI controller 214, and sample controller 202. When the read buffer is empty and it is its turn of TDM, the corresponding read request is issued, and the memory read data is available at a read distribute controller at the next clock. The address for each request is generated in by the read merge controller. A read-write merge controller collects reads and writes from both of the read merge controller and the write merge controller. The read-write merge controller is configured to follow TDM states generated by the TDM controller 212 to send memory a read or write command based on the allocation of time slots associated with an operating mode and TDM state.

Retry mode is useful when one physical sector is read at any time and processed in seqblk sequentially. Some features such as sample averaging, ITI cancellation, and NSMR can be worked together with retry mode. Averaging mode only works when retry mode is also turned on. The averaging mode is useful when the sync is missing or data is not converged during normal operation, and data has to be recovered in some way so that a particular sector of data is re-read as many times as needed. By averaging the input data for every read on the same physical sector location, chances of data recovery are increased. In some embodiments, input sample is 2's complement signed 6 bit, and averaged data is 9 bit. When the TDM controller 212 is in an averaging state, it allocates at least six slots to two active clients: Y average data write occur once every 6 octal rate clock, and Y average data read occur once every 6 octal rate clock. When TDM controller is in a decoding state, it allocates at least six slots to three active clients: MAP0 samples read occur once every 4 octal rate clock, MAP1 samples read occur once every 4 octal rate clock, and MAP2 samples read occur once every 4 octal rate clock.

ITI cancellation mode can be turned on in either normal mode or retry mode. In normal mode, the HD data of current track is supplied by the MAP detectors 206 and HD data of adjacent track is provided by RWI; therefore, there is no need for the buffer 200 to provide any data or store any data. In retry mode, the buffer 200 needs to provide data samples and store data samples as well as HD data either from MAP detector 206 or from a backend detector. When buffer service data for ITI operation, no backend MAP read of Ybuffer is performed. In some embodiments, single-sided ITI cancellation without averaging is enabled in the normal mode. There is no extra sample memory access dedicated for the ITI transaction so the TDM state transition is the same as that in normal mode operation. Slot allocation is also the same as in normal mode.

In some embodiments, double-sided ITI cancellation without y-average is enabled when retry mode is turned on. The ITI cancellation operation is divided into two steps: first side and second side. When first side ITI cancellation operation is active, the data sample is stored to the buffer 200 and so is the HD data from the MAP detector. When first side operation is finished, it switches to second side ITI cancellation operation. Single side cancelled data sample previously stored in the buffer 200 as well as HD data are retrieved. At the same time, the result of second side operation is stored back to the buffer 200. After the second side ITI cancellation is finished, backend MAP retrieves double side cancelled sample from the buffer 200 and sends it to backend for further processing. When the TDM controller 212 is in ITI cancellation state, at least six slots are allocated for the following clients: Y samples write occur once every 9 octal rate clock, Y samples read occur once every 9 octal rate clock, HD samples write occur once every 54 octal rate clock, HD samples read occur once every 54 octal rate clock, where HD write and read are not overlapped in time. When the TDM controller 212 is in decoding state, at least six slots are allocated for the following clients: MAP0 samples read occur once every 6 octal rate clock, MAP1 samples read occur once every 6 octal rate clock, and MAP2 samples read occur once every 6 octal rate clock.

In some embodiments, ITI cancellation and averaging modes are simultaneously enabled (only possible in retry mode). In addition to read and write of 9-bit averaged samples to the sample memory 204, 1-bit hard decision data from backend detector needs to be stored and retrieved. The operation is broken down to the following phases: averaging data sample; sending data to backend detector; storing HD data; ITI first side; and ITI second side. When the TDM controller 212 is in averaging state, at least six slots are allocated for the following clients: 9-bit averaged y sample read from Ybuffer occur once every 6 octal rate clock and 9-bit averaged y sample write to Ybuffer occur once every 6 octal rate clock. When the TDM controller 212 is in decoding state, at least six slots are allocated for the following clients: 9-bit averaged y sample read for map0 occur once every 4 octal rate clock, 9-bit averaged y sample read for map1 occur once every 4 octal rate clock, and 9-bit averaged y sample read for map2 occur once every 4 octal rate clock. When the TDM controller 212 is in HD data writing state, at least six slots are allocated for the following clients: 1-bit backend hard decision data stored into Ybuffer occur once every 54 octal rate clock. When the TDM controller 212 is in ITI first side state, at least six slots are allocated for the following clients: 9-bit averaged y sample read from Ybuffer occur once every 6 octal rate clock, 6-bit ysample write to Ybuffer occur once every 9 octal rate clock, and 1-bit HD read from Ybuffer occur once every 54 octal rate clock. When the TDM controller 212 is in ITI second side state, at least six slots are allocated for the following clients: 6-bit y sample read from Ybuffer occur once every 9 octal rate clock, 6-bit y sample write to Ybuffer occur once every 9 octal rate clock, and 1-bit HD read from Ybuffer occur once every 54 octal rate clock.

In some embodiments, a no-sync-mark recovery (NSMR) mode is enabled with retry mode. MAP detectors 206 reading data from the sample memory 204 need to know where to start retrieval of data when sweeping a sync mark search window. Then, data from fragments are assembled to form a contiguous chunk with proper packing. To avoid possibility of data discontinuation in sending three chunks of MAP data at the same time, the TDM controller 212 allocates at least six slots for three MAP reads. In some embodiments, the memory address of each fragment is tracked in 1T resolution. In some embodiments, sync mark search window determines the memory address in NSMR operation. In some embodiments, the erasure signal is disabled when NSMR mode is turned on.

In some embodiments, a micro channel architecture (MCA) mode is enabled with retry mode. Accordingly, a 32-bit data access port to the sample memory 204 is available to a MCA interface controller. When MCA mode is enabled, it allows an external processor to access to the sample memory 204 through the MCA interface controller. When MCA interface is enabled, any other clients trying to access to the sample memory 204 are blocked. In some embodiments, MCA interface is 32-bit data bus and addressing is based on memory row. In some embodiments, the MCA interface controller is configurable to work in either 16-bit mode or 32-bit mode. In 16-bit mode only the lower 16 bits are used. When 32 bit data bus is used, it requires software to write or read for 27 times in a row without intervention or interleaved with write or read. When 16 bit data bus is used, it requires software to write or read for 54 times in a row without intervention or interleaved with write or read. Three sif registers are programmed to start a MCA transaction.

In some embodiments, a QMON interface is provided for an ESNR module to use the sample memory 204 as a scratch pad for calculation. In some embodiments, QMON accesses the sample memory 204 through a 288-bit data bus. In some embodiments, two sif registers are turned on to enable the QMON interface: sif_p5_iteration and sif_esnr_en. When QMON interface is enabled, all other clients are blocked from accessing the sample memory. In some embodiments, QMON and MCA are not enabled at the same time to avoid bus contention. In some embodiments, the buffer 200 is further configured to store and read data as directed by a QMON module.

In some embodiments, the buffer 200 keeps track of where to split sector data into three chunks based on the chunk size and writes to the memory at line boundary. In some embodiments, the buffer 200 tracks the number of extra data sets (6 samples per set) in each of the chunks for read alignment. In some embodiments, the buffer 200 tracks extra bit sets for address adjustment during read operation for a 3-stream detector. In some embodiments, buffer access bandwidth requirement is not greater than 36 samples (216 bits) per quarter rate clock.

It should be recognized that in some embodiments the various steps described throughout the present disclosure may be carried out by a single computing system or multiple computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a memory medium.

Program instructions implementing methods, such as those manifested by embodiments described herein, may be transmitted over or stored on carrier medium. The carrier medium may be a transmission medium, such as, but not limited to, a wire, cable, or wireless transmission link. The carrier medium may also include a storage medium such as, but not limited to, a read-only memory, a random access memory, a magnetic or optical disk, or a magnetic tape.

Embodiments manifesting methods described herein may include storing results in a storage medium. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that any embodiment of the disclosure manifested above as a system or method may include at least a portion of any other embodiment described herein. Those having skill in the art will appreciate that there are various embodiments by which systems and methods described herein can be effected, and that the implementation will vary with the context in which an embodiment of the disclosure deployed.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:
1. A system for managing data samples, comprising:
a sample controller configured for writing data samples to a sample memory and reading data samples from the sample memory, the sample controller being further configured for generating write and read addresses for writing and reading data samples to or from the sample memory;

a plurality of detectors configured for reading data samples from the sample memory and decoding the data samples read from the sample memory utilizing a maximum a posteriori decoding algorithm;

a noise predictive calibrator configured for reading data samples from the sample memory and calibrating an impulse response coefficient of a filter based upon an input noise associated with the data samples read from the sample memory, wherein the filter is configured to at least partially compensate for the input noise utilizing the impulse response coefficient; and a time division multiplexing controller configured for facilitating access to the sample memory based upon one or more modes of operation and one or more time division multiplexing states, wherein facilitating access to the sample memory includes allocating time slots for accessing the sample memory according to the one or more modes of operation and the time division multiplexing states, wherein the time division multiplexing controller is further configured to allocate slots for concurrent access by the sample controller, the plurality of detectors, and the noise predictive calibrator when a normal mode is enabled and further configured to allocate slots excluding at least one of the sample controller, the plurality of detectors, and the noise predictive calibrator from accessing the sample memory when a retry mode is enabled.

2. The system of claim 1, wherein the time division multiplexing controller is configured to allocate at least one slot allowing the sample controller to write data samples to the sample memory, at least three slots allowing the plurality of detectors to read data samples from the sample memory, and at least one slot allowing the noise predictive calibrator to read data samples from the sample memory when the normal mode is enabled.

3. The system of claim 1, wherein the time division multiplexing controller is configured to allocate at least three slots allowing the sample controller to read averaged data samples from the sample memory and at least three slots allowing the sample controller to write averaged data samples to the sample memory when the retry mode is enabled, a sample averaging mode is enabled, and the time division multiplexing controller is in an averaging state.

4. The system of claim 3, wherein the time division multiplexing controller is configured to allocate at least six slots allowing the plurality of detectors to read data samples from the sample memory when the retry mode is enabled, the sample averaging mode is enabled, and the time division multiplexing controller is in a decoding state.

5. The system of claim 1, wherein the time division multiplexing controller is configured to allocate at least one slot allowing the sample controller to write data samples to the sample memory, at least one slot allowing the sample controller to read data samples from the sample memory, at least one slot allowing an inter-track interference cancellation controller to write hard decision data to the sample memory, and at least one slot allowing the inter-track interference cancellation controller to read hard decision data from the sample memory when the retry mode is enabled, an inter-track interference cancellation mode is enabled, and the time division multiplexing controller is in a cancellation state.

6. The system of claim 5, wherein the time division multiplexing controller is configured to allocate at least six slots allowing the plurality of detectors to read data samples from the sample memory when the retry mode is enabled, the inter-track interference cancellation mode is enabled, and the time division multiplexing controller is in a decoding state.

7. The system of claim 1, wherein the time division multiplexing controller is configured to allocate at least six slots allowing an inter-track interference cancellation controller to write hard decision data to the sample memory when the retry mode is enabled, an inter-track interference cancellation mode is enabled, a sample averaging mode is enabled, and the time division multiplexing controller is in a hard decision writing state.

8. The system of claim 7, wherein the time division multiplexing controller is configured to allocate at least two slots allowing the sample controller to read averaged data samples from the sample memory, at least two slots allowing the sample controller to write data samples to the sample memory, and at least two slots allowing the inter-track interference cancellation controller to read hard decision data from the sample memory when the retry mode is enabled, the inter-track interference cancellation mode is enabled, the sample averaging mode is enabled, and the time division multiplexing controller is in a first cancellation state.

9. The system of claim 8, wherein the time division multiplexing controller is configured to allocate at least two slots allowing the sample controller to read data samples from the sample memory, at least two slots allowing the sample controller to write data samples to the sample memory, and at least two slots allowing the inter-track interference cancellation controller to read hard decision data from the sample memory when the retry mode is enabled, the inter-track interference cancellation mode is enabled, the sample averaging mode is enabled, and the time division multiplexing controller is in a second cancellation state.

10. The system of claim 1, wherein the time division multiplexing controller is further configured to allocate time slots for accessing the sample memory in accordance with at least one of a no-sync-mark recovery mode, a micro channel architecture mode, and a QMON interface mode.

11. The system of claim 1, further comprising:
a fragment controller configured for providing timing information to the sample controller for writing at least one of end of sector bits, bridging bits, and start of sector bits to the sample memory.

12. The system of claim 1, further comprising:
a chunk controller configured for providing timing information to the plurality of detectors for distributing data samples read from the sample memory evenly among the plurality of detectors for parallel processing.

13. The system of claim 1, further comprising:
an erasure controller configured for providing an indication when no sync mark is found and no valid prior data samples are available.

14. The system of claim 1, further comprising:
a no-sync-mark recovery controller configured for tracking state variables of at least one no-sync-mark recover iteration, the state variables including at least one of sync mark search window position, address generation of corresponding memory location, valid data pattern at fragment border appeared in memory line, sync mark missing fragment crossing chunks, and address generation of memory location to construct chunk from one or more fragments.

15. A system for managing data samples, comprising:
a sample acquisition module configured for receiving data samples from a storage device;
a sample controller configured for writing data samples received from the sample acquisition module to a sample memory and reading data samples from the sample memory, the sample controller being further configured for generating write and read addresses for writing and reading data samples to or from the sample memory;

a plurality of detectors configured for reading data samples from the sample memory and decoding the data samples read from the sample memory utilizing a maximum a posteriori decoding algorithm, the plurality of detectors further configured for sending maximum a posteriori data associated with the decoded data samples to a decoder;

a noise predictive calibrator configured for reading data samples from the sample memory and calibrating an impulse response coefficient of a filter based upon an input noise associated with the data samples read from the sample memory, wherein the filter is configured to at least partially compensate for the input noise utilizing the impulse response coefficient; and a time division multiplexing controller configured for facilitating access to the sample memory based upon one or more modes of operation and one or more time division multiplexing states, wherein facilitating access to the sample memory includes allocating time slots for accessing the sample memory according to one or more modes of operation and one or more time division multiplexing states, wherein the time division multiplexing controller is configured to allocate slots for concurrent access by the sample controller, the plurality of detectors, and the noise predictive calibrator when a normal mode is enabled and further configured to allocate slots excluding at least one of the sample controller, the plurality of detectors, and the noise predictive calibrator from accessing the sample memory when a retry mode is enabled.

16. The system of claim 15, further comprising:
a fragment controller configured for providing timing information to the sample controller for writing at least one of end of sector bits, bridging bits, and start of sector bits to the sample memory.

17. The system of claim 15, further comprising:
a chunk controller configured for providing timing information to the plurality of detectors for distributing data samples read from the sample memory evenly among the plurality of detectors for parallel processing.

18. The system of claim 15, further comprising:
an erasure controller configured for providing an indication when no sync mark is found and no valid prior data samples are available.

19. The system of claim 15, further comprising:
a no-sync-mark recovery controller configured for tracking state variables of at least one no-sync-mark recover iteration, the state variables including at least one of sync mark search window position, address generation of corresponding memory location, valid data pattern at fragment border appeared in memory line, sync mark missing fragment crossing chunks, and address generation of memory location to construct chunk from one or more fragments.

20. A method of managing data samples, comprising:
receiving data samples from a storage device;
generating one or more address for writing data samples to or reading data samples from a sample memory utilizing a sample controller;
writing the received data samples to a sample memory utilizing the sample controller;
decoding data samples read from the sample memory by a plurality of detectors utilizing a maximum a posteriori decoding algorithm;
calibrating an impulse response coefficient of a filter based upon an input noise associated with data samples read from the sample memory by a noise predictive calibrator, wherein the filter is configured to at least partially compensate for the input noise utilizing the impulse response coefficient; and
facilitating access to the sample memory based upon one or more modes of operation and one or more time division multiplexing states, wherein facilitating access to the sample memory includes allocating time slots for accessing the sample memory according to the one or more modes of operation and the time division multiplexing states, wherein the time slots are allocated for concurrent access by the sample controller, the plurality of detectors, and the noise predictive calibrator when a normal mode is enabled, and wherein the time slots are allocated to exclude at least one of the sample controller, the plurality of detectors, and the noise predictive calibrator from accessing the sample memory when a retry mode is enabled.

* * * * *